(12) United States Patent
Hamada

(10) Patent No.: US 7,646,073 B2
(45) Date of Patent: Jan. 12, 2010

(54) FERROELECTRIC CAPACITOR AND FERROELECTRIC MEMORY

(75) Inventor: Yasuaki Hamada, Suwa (JP)

(73) Assignee: Seiko Epson Corporation (JP)

( * ) Notice: Subject to any disclaimer, the term of this patent is extended or adjusted under 35 U.S.C. 154(b) by 352 days.

(21) Appl. No.: 11/680,111

(22) Filed: Feb. 28, 2007

(65) Prior Publication Data
US 2007/0210361 A1    Sep. 13, 2007

(30) Foreign Application Priority Data
Mar. 8, 2006 (JP) .............................. 2006-062377

(51) Int. Cl.
*H01L 29/00* (2006.01)
(52) U.S. Cl. .............................. 257/414; 257/E27.107; 438/785
(58) Field of Classification Search .......... 257/E27.107, 257/414; 438/785
See application file for complete search history.

(56) References Cited

U.S. PATENT DOCUMENTS

2001/0051381 A1 *    12/2001    Yang et al. ..................... 438/3

FOREIGN PATENT DOCUMENTS

| JP | 2004-031533 | 1/2004 |
| JP | 2006-062377 | 3/2006 |

* cited by examiner

*Primary Examiner*—Davienne Monbleau
*Assistant Examiner*—Matthew Reames
(74) *Attorney, Agent, or Firm*—Harness, Dickey & Pierce, P.L.C.

(57) ABSTRACT

A ferroelectric capacitor includes: a base substrate; a buffer layer formed above the base substrate; a lower electrode formed above the buffer layer; a ferroelectric layer formed above the lower electrode; and an upper electrode formed above the ferroelectric layer, wherein the buffer layer includes titanium (Ti) and cobalt (Co) as metal elements, and a metal element ratio x is $0.05 \leq x < 1$, when Ti:Co=1−x:x.

4 Claims, 2 Drawing Sheets

FERROELECTRIC CAPACITOR AND FERROELECTRIC MEMORY

The entire disclosure of Japanese Patent Application No. 2006-062377, filed Mar. 8, 2006 is expressly incorporated by reference herein.

BACKGROUND

1. Technical Field

The present invention relates to ferroelectric capacitors and ferroelectric memories.

2. Related Art

Ferroelectric memories are characterized by nonvolatility, high-speed wiring and reading, and low power consumption, and are one of powerful representatives as a next-generation nonvolatile memory. The most popular structures of ferroelectric memories are 1T1C types. In the stacked type structure among the 1T1C types, a lower electrode of a ferroelectric capacitor is connected to a plug electrode for electrically connecting the ferroelectric capacitor to a transistor, and it is important to secure the electrical conduction between the lower electrode and the plug electrode. For example, Japanese laid-open patent application JP-A-2004-31533 proposes the use of a Ir or Ir oxide layer as a buffer layer between a Pt lower electrode and a W plug in a stacked type ferroelectric memory.

However, when Ir or Ir oxide is used as a buffer layer, the ferroelectric material on the Pt electrode may have random orientations, and the control of its orientation may be difficult. On the other hand, when Ti or Ti oxide that excels in controlling the orientation of ferroelectric material is used as a buffer layer, the buffer layer may have higher resistance as a result of oxidation and loss of conductivity, and it is difficult to secure the conductivity between the ferroelectric capacitor and the plug electrode.

SUMMARY

In accordance with an advantage of some aspects of the invention, the conductivity to a ferroelectric capacitor can be readily secured, and the orientation of ferroelectric material can be controlled.

(1) In accordance with an embodiment of the invention, a ferroelectric capacitor includes: a buffer layer formed above a base substrate; a lower electrode formed above the buffer layer; a ferroelectric layer formed above the lower electrode; and an upper electrode formed above the ferroelectric layer, wherein the buffer layer includes titanium (Ti) and cobalt (Co) as metal elements, and a metal element ratio x is $0.05 \leq x < 1$ when Ti:Co=1−x:x.

According to the feature described above, the buffer layer contains titanium and cobalt as metal elements in a predetermined ratio, such that an increase in the resistance due to oxidation can be avoided, and the conductivity can be improved. Furthermore, because the buffer layer includes titanium, the orientation of ferroelectric material in an upper layer can be excellently controlled, and a ferroelectric layer in a single orientation can more readily be formed.

It is noted that the expression "B being provided above a specific member A" includes a case where B is provided directly on A, and a case where B is provided above A through another layer or the like.

(2) In the ferroelectric capacitor, the metal element ratio of the buffer layer may be $0.05 \leq x \leq 0.33$.

According to the feature described above, as indicated in a binary phase diagram of cobalt and titanium, when the content of cobalt is less than about 33 at %, $CoTi_2$ having a crystal structure with titanium as a base element can be formed. Accordingly, a ferroelectric layer better oriented in a single orientation can be formed.

(3) In the ferroelectric capacitor, the buffer layer may be a layer composed of an ally or a metal oxide including titanium and cobalt.

(4) The ferroelectric capacitor may further include a base metal layer composed of at least one layer formed above the base substrate, wherein the buffer layer may be formed above the base metal layer.

(5) In the ferroelectric capacitor, the base metal layer may include an aluminum titanium nitride layer.

(6) A ferroelectric memory in accordance with an embodiment of the invention includes: a switching transistor; a plug electrode electrically connected to the switching transistor; and a ferroelectric capacitor formed above the plug electrode wherein the ferroelectric capacitor includes a buffer layer, a lower electrode, a ferroelectric layer and an upper electrode laminated in this order from the plug electrode, wherein the buffer layer includes titanium (Ti) and cobalt (Co) as metal elements, and a metal element ratio x is $0.05 \leq x < 1$ when Ti:Co=1−x:x.

According to the feature described above, the buffer layer contains titanium and cobalt as metal elements in a predetermined ratio, such that an increase in the resistance due to oxidation can be avoided, and the conductivity can be improved. Furthermore, because the buffer layer includes titanium, the orientation of ferroelectric material in an upper layer can be excellently controlled, and a ferroelectric layer in a single orientation can more readily be formed.

DESCRIPTION OF EXEMPLARY EMBODIMENTS

A preferred embodiment of the invention is described below with reference to the accompanying drawings.

Figure 1:
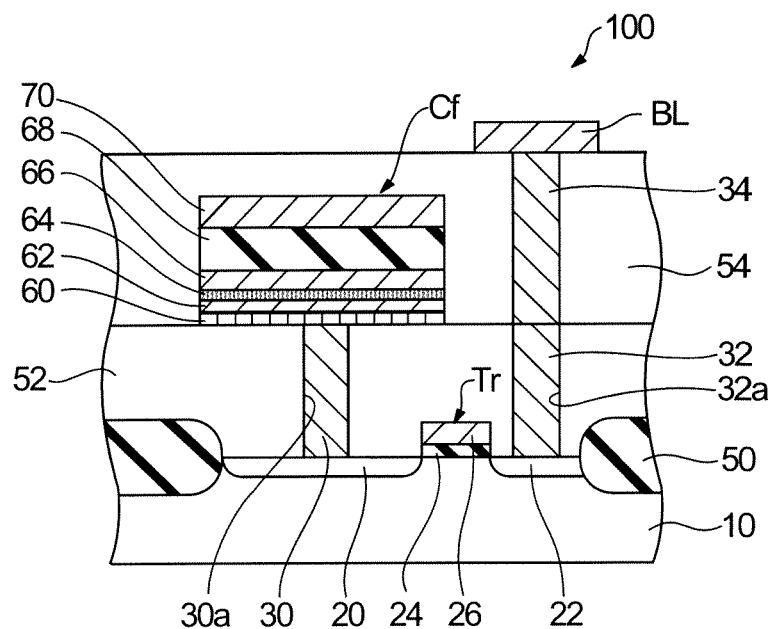
FIG. 1 is a view showing an example of a ferroelectric memory including a ferroelectric capacitor in accordance with an embodiment of the invention.
Figure 2:
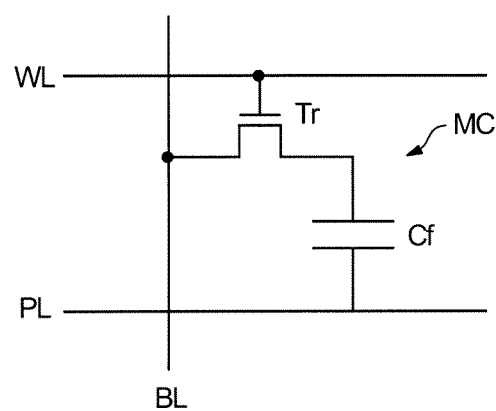
FIG. 2 is a circuit diagram of the ferroelectric memory shown in FIG. 1.

FIG. 1 is a view showing an example of a ferroelectric memory (including a ferroelectric capacitor) in accordance with an embodiment of the invention, and FIG. 2 is a circuit diagram of the ferroelectric memory shown in FIG. 1.

First, a structure of the ferroelectric memory in accordance with the present embodiment is described.

A ferroelectric memory 100 includes a plurality of memory cells MC, wherein the memory cells MC are formed on a semiconductor substrate 10, and isolated from one another by an element isolation region 50. In the example shown in FIG. 1, each of the memory cells MC uses a so-called 1T1C type configuration that includes a switching transistor Tr and a ferroelectric capacitor Cf.

The switching transistor Tr may be, for example, an n-channel type MOS transistor, and formed on a semiconductor substrate 10. More concretely, the switching transistor Tr includes a source 22 and a drain 20 which are formed by injecting predetermined impurity in the semiconductor substrate 10, a gate dielectric layer 24 formed on the surface of the semiconductor substrate 10, and a gate electrode 26 formed on the gate dielectric layer 24. The switching transistor Tr functions as a switch that turns on and off the connection between the ferroelectric capacitor Cf and a bit line BL.

An interlayer dielectric layer (oxide layer) 52 is provided on the surface of the semiconductor substrate 10, and the ferroelectric capacitor Cf is formed on the interlayer dielectric layer 52. In other words, the ferroelectric capacitor Cf is formed on the base substrate (including the semiconductor substrate 10 and the interlayer dielectric layer 52). Holes 30a and 32a, which expose the drain 20 and the source 22 of the switching transistor Tr, respectively, are formed in the interlayer dielectric layer 52, and plug electrodes 30 and 32 are formed in the holes 30a and 32a, respectively. Another interlayer dielectric layer 54 is further formed on the interlayer dielectric layer 52, and the source 22 of the switching transistor Tr is connected to a bit line BL through the plug electrode 32 and a plug electrode 34 formed in the interlayer dielectric layer 54.

The switching transistor Tr has the gate electrode 26 connected to a word line WL, the source 22 connected to a bit line BL, and the drain 20 connected to one end of the ferroelectric capacitor Cf through the plug electrode 30. The other end of the ferroelectric capacitor Cf is connected to a plate line PL.

The ferroelectric capacitor Cf is formed on the plug electrode 30, and includes base metal layers 60 and 62, a buffer layer 64, a lower electrode 66, a ferroelectric layer 68 and an upper electrode 70 laminated in this order from the plug electrode 30.

The plug electrode 30 may be composed of any material having conductivity without any particular limitation, and may be composed of a tungsten (W) layer. For example, the interlayer dielectric layer 52 may be formed on the semiconductor substrate 10 by a CVD method, an upper surface of the interlayer dielectric layer 52 may be planarized by a CMP method, the hole 30a may be formed by dry etching, and the tungsten layer may be embedded in the hole 30a by a CVD method. Before forming the tungsten layer, a titanium (Ti) layer and a titanium nitride (TiN) layer on the Ti layer may be formed as a barrier to improve adhesion and prevent diffusion.

Titanium aluminum nitride (TiAlN) layers and iridium (Ir) layers may be enumerated as an example of the base metal layers 60 and 62 that are laminated on the plug electrode 30. More specifically, the base metal layer 60 on the plug electrode 30 may be formed from at least one layer selected from a titanium layer, a titanium nitride layer and an alumni titanium nitride layer, and the base metal layer 62 on the base metal layer 60 may be formed from a platinum system metal. Alternatively, the upper base metal layer 62 may be omitted, and only the lower base metal layer 60 may be formed, or both of the base metal layers 60 and 62 may be omitted, and the buffer layer 64 may be formed directly on the plug electrode 30.

The buffer layer 64 includes titanium (Ti) and cobalt (Co) as metal elements. The buffer layer 64 may be an alloy of titanium and cobalt, or an oxide layer of these metals. The buffer layer 64 can be formed by an appropriate film forming method, such as, a sputter method, a CSD method, a MOCVD method or a PLD method. For example, in the case of a sputter method, the buffer layer 64 can be formed by a metal sputter method or an oxide sputter method.

Moreover, the metal element ratio x of titanium and cobalt in the buffer layer 64 may be $0.05 \leq x < 1$, and more preferably be $0.05 \leq x \leq 0.33$, when Ti:Co=1−x:x, as can be derived from an embodiment example to be described below.

As the lower electrode 66 on the buffer layer 64, platinum (Pt), which is a precious metal that has a lattice constant close to that of lead zirconate titanate (PZT) system ferroelectric material and is difficult to be oxidized, can be used. In this case, a PZT system ferroelectric layer 68 oriented to (111) can be formed on the lower electrode 66 that is composed of Pt oriented to (111). The ferroelectric layer 68 may be composed of PZTN material in which the titanium site of PZT system material is replaced with niobate (Nb), or as other examples, may be composed of SBT system material, BST system material, BIT system material, BLT system material or the like. It is noted that the ferroelectric layer 68 can be formed by a solution coating method (including a sol-gel method, a MOD (Metal Organic Decomposition) method, etc.), a sputter method, a CVD method, or a MOCVD (Metal Organic CVD) method. It is noted that the upper electrode 70 can be composed of a material similar to that of the lower electrode 66.

In accordance with the present embodiment, the buffer layer 64 contains titanium and cobalt as metal elements in a predetermined ratio, such that an increase in the resistance due to oxidation can be avoided, and the conductivity can be improved. In other words, even when oxidation of the metal occurs in an annealing treatment that is conducted during or after the manufacturing process in manufacturing the ferroelectric capacitor, the buffer layer 64 can be maintained at a low resistance. Accordingly, when electrical conduction is to be made from the side of the buffer layer 64, in other words, from the side of the lower electrode 66 of the ferroelectric capacitor Cf, good conductivity can be secured. In other words, in the example shown in FIG. 1, excellent electrical connection can be made between the ferroelectric capacitor Cf and the switching transistor Tr.

Furthermore, because the buffer layer 64 includes titanium, the orientation of ferroelectric material in an upper layer can be excellently controlled, and the ferroelectric layer 68 in a single orientation can more readily be formed. It is known that, when a layer including titanium is formed as a base of the lower electrode 66 that is a Pt layer, the ferroelectric layer 68 would likely be formed into a single orientation. In other words, according to the present embodiment, the conductivity can not only be secured as described above, but the orientation of the ferroelectric material can also be controlled, and the ferroelectric capacitor having a single orientation can be provided.

Next, the material of the buffer layer described above is considered in the following embodiment examples 1 and 2.

EMBODIMENT EXAMPLE 1

In the present embodiment example, the resistance of metal oxide layers including titanium and cobalt was compared with the resistance of metal oxide layers including titanium and other metals.

Concretely, titanium tetraisopropoxide and an organometallic compound of each of Co, Nb, Si, Sn and Zr were mixed in a metal element ratio of 95:5 to form a precursor solution, and the precursor solutions were coated on Pt (111) electrodes, respectively, to form thin films having a film thickness of about 200 nm. Then, the coated films on the Pt electrodes were heat treated at 650° C., and Pt upper electrodes were further formed, thereby forming capacitors.

Five kinds of samples and a capacitor sample including $TiO_2$ material, a total of six kinds of samples, were fabricated by the process described above, and the resistances of these capacitor samples were compared as shown in Table 1 below.

TABLE 1

| Material | Resistance ($\Omega \cdot cm^2$) |
|---|---|
| $TiO_2$ | $2 \times 10^6$ |
| 95% $TiO_2$—5% CoO | $1 \times 10^{-2}$ |
| 95% $TiO_2$—5% $Nb_2O_5$ | $2 \times 10^5$ |
| 95% $TiO_2$—5% $SiO_2$ | $1 \times 10^8$ |
| 95% $TiO_2$—5% $SnO_2$ | $3 \times 10^5$ |
| 95% $TiO_2$—5% $ZrO_2$ | $1 \times 10^6$ |

According to Table 1, it is observed that only the mixture of $TiO_2$ and CoO exhibited conductivity, and the other metal oxides exhibited high resistance. In other words, it is understood that the metal oxide including titanium and cobalt has good conductivity.

EMBODIMENT EXAMPLE 2

Figure 3:
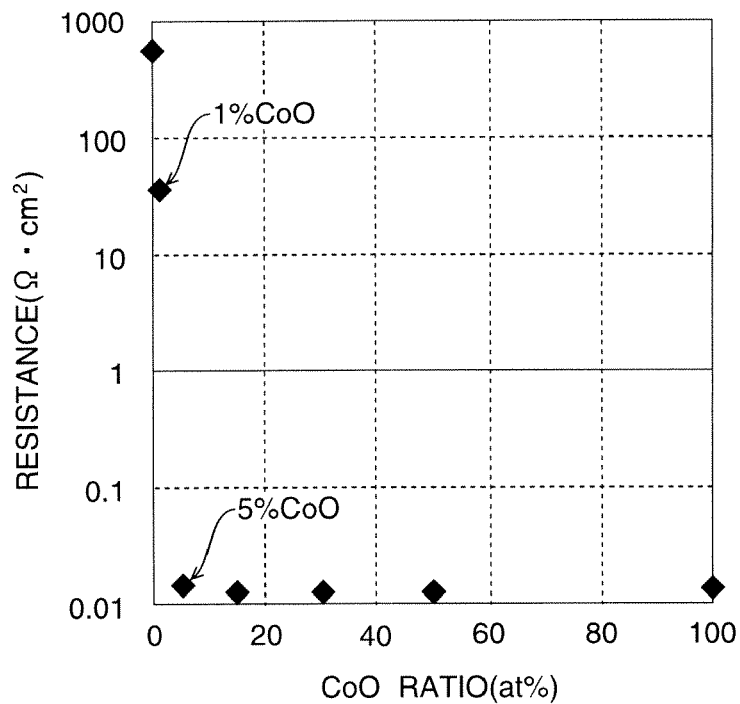
FIG. 3 is a diagram showing changes in the resistance based on composition ratios of $TiO_2:CoO$.

In the present embodiment example, metal element ratios of titanium and cobalt were considered. FIG. 3 is a diagram showing changes in the resistance based on composition ratios of $TiO_2$ to CoO, and FIG. 4 is a binary phase diagram of Co and Ti.

In the present embodiment examples, sample capacitors were fabricated. Concretely, a solution in which titanium tetra-n-butoxide was dissolved in n-buthanol in a concentration of 0.2 mol/kg, and a solution in which cobalt (II) acetylacetonato was dissolved in n-buthanol in a concentration of 0.2 mol/kg were prepared, and the two solutions were mixed at composition ratios from 100:0 ($TiO_2$) to 0:100 (CoO). These mixed solutions were coated on Pt (111) electrodes to form thin films having a film thickness of about 40 nm. Then, these thin films on the Pt electrodes were heat treated at 650° C., and Pt upper electrodes were further formed, thereby fabricating capacitors.

According to the measurement results shown in FIG. 3, the composition ratio of $TiO_2$:CoO=99:1 (corresponding to 1 at % CoO in FIG. 3) exhibited an intermediate resistance value, and the composition ratios of $TiO_2$:CoO=95:5 (corresponding to 5 at % CoO in FIG. 3) or with greater CoO compositions exhibited very small resistances. In other words, as the resistance value of about 1 ($\Omega \cdot cm^2$) or less can be said to provide excellent conductivity, it can be said, in consideration of the above, that, when the atom percentage of CoO is 5 at % or greater, in other words, when x is $0.05 \leq x < 1$ in Ti:Co=1-x:x, an increase in the resistance due to oxidation can be avoided, and the conductivity can be improved.

Figure 4:
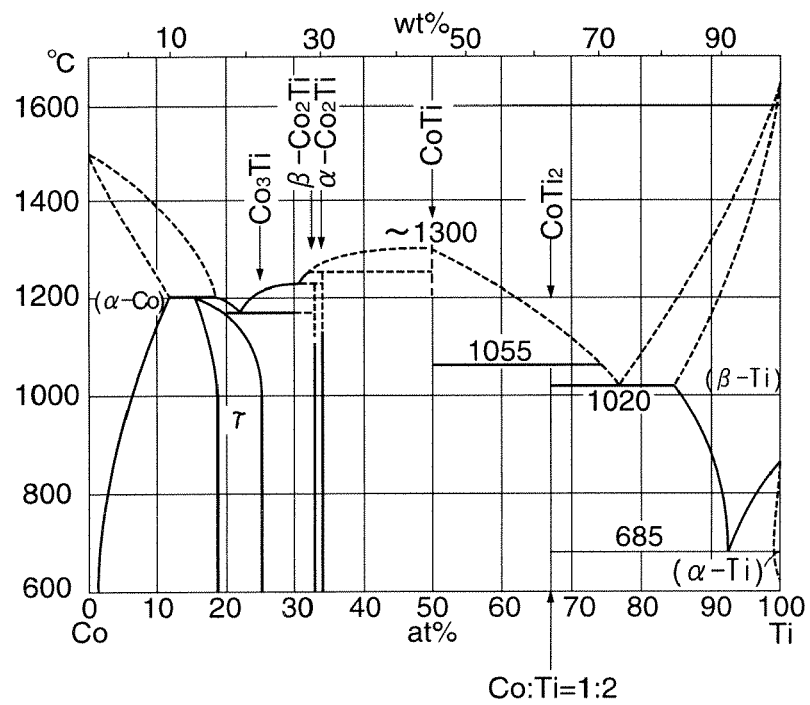
FIG. 4 is a binary phase diagram of cobalt and titanium.

Also, it can be understood from the phase diagram shown in FIG. 4 that, at Co:Ti=1:2, an alloy, $CoTi_2$ is formed. For this reason, when the composition ratio of Co in Co—Ti alloy is about 33 at % or less, the crystal structure with Ti as a base element can be maintained. In other words, it can be said that, when x is $0.05 \leq x < 0.33$ in Ti:Co=1-x:x, it is possible not only to avoid an increase in the resistance as described above, but the orientation of the ferroelectric material can also be controlled, and the ferroelectric capacitor having a single orientation can be provided.

It is noted that, in the embodiments of the invention described above, the use of Fe in place of Co in the buffer layer described above may provide similar effects.

The invention is not limited to the embodiments described above, and many modifications can be made. For example, the invention may include compositions that are substantially the same as the compositions described in the embodiments (for example, a composition with the same function, method and result, or a composition with the same objects and result). Also, the invention includes compositions in which portions not essential in the compositions described in the embodiments are replaced with others. Also, the invention includes compositions that achieve the same functions and effects or achieve the same objects of those of the compositions described in the embodiments. Furthermore, the invention includes compositions that include publicly known technology added to the compositions described in the embodiments.

What is claimed is:

1. A ferroelectric capacitor comprising:
   a base substrate;
   a buffer layer formed on the base substrate;
   a first electrode formed on the buffer layer;
   a ferroelectric layer formed on the lower electrode; and
   a second electrode formed on the ferroelectric layer,
   wherein the buffer layer is formed of a metal oxide layer including titanium (Ti) and cobalt (Co), an element ratio (x) of which is expressed as Ti:Co=1-x:x, where $0.05 \leq x < 1$.

2. The ferroelectric capacitor according to claim 1, the first electrode being formed of platinum.

3. The ferroelectric capacitor according to claim 1, the first electrode being oriented in a (111) direction, and the ferroelectric film being oriented in an (111) orientation.

4. The ferroelectric memory according to claim 1, the ferroelectric layer being formed of PZT.

* * * * *